(12) United States Patent
Park et al.

(10) Patent No.: US 12,287,147 B2
(45) Date of Patent: Apr. 29, 2025

(54) WAFER PROCESSING EQUIPMENT AND METHOD OF MANUFACTURING SEMICONDUCTOR DEVICE

(71) Applicant: SAMSUNG ELECTRONICS CO., LTD., Suwon-si (KR)

(72) Inventors: Sangjine Park, Suwon-si (KR); Youngtae Kim, Incheon (KR); Jihoon Jeong, Seongnam-si (KR); Younghoo Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 804 days.

(21) Appl. No.: 17/493,346

(22) Filed: Oct. 4, 2021

(65) Prior Publication Data

US 2022/0325953 A1 Oct. 13, 2022

(30) Foreign Application Priority Data

Apr. 5, 2021 (KR) .................. 10-2021-0044297

(51) Int. Cl.
*F26B 5/00* (2006.01)
*F26B 3/02* (2006.01)
(Continued)

(52) U.S. Cl.
CPC ............... *F26B 5/005* (2013.01); *F26B 3/02* (2013.01); *G03F 7/40* (2013.01); *H01L 21/67034* (2013.01)

(58) Field of Classification Search
CPC ... F26B 5/005; F26B 3/02; G03F 7/40; H01L 21/67034; H01L 21/67103; H01L 21/6719; H01L 21/6715
See application file for complete search history.

(56) References Cited

U.S. PATENT DOCUMENTS

| 6,602,351 B2 | 8/2003 | DeYoung et al. |
| 6,905,555 B2 | 6/2005 | DeYoung et al. |

(Continued)

FOREIGN PATENT DOCUMENTS

| KR | 101681190 B1 | 12/2016 |
| KR | 10-2018-0050236 A | 5/2018 |

(Continued)

OTHER PUBLICATIONS

Translation KR-20190130974-A (Year: 2019).*

*Primary Examiner* — Jessica Yuen
(74) *Attorney, Agent, or Firm* — Sughrue Mion, PLLC

(57) ABSTRACT

A fluid supply device configured to supply a processing fluid to a wafer processing device that includes a chamber is provided. The fluid supply device includes a reservoir configured to change the processing fluid into a supercritical fluid state; a wafer protecting device comprising a body configured to prevent a wafer in the chamber of the wafer processing device from being damaged by the processing fluid in the supercritical fluid state by receiving the processing fluid in the supercritical fluid state and limiting a speed of the processing fluid; and a fluid supply line configured to provide a path for the processing fluid between the reservoir and the wafer protecting device and a path for the processing fluid between the wafer protecting device and the wafer processing device.

10 Claims, 12 Drawing Sheets

(51) Int. Cl.
*G03F 7/40* (2006.01)
*H01L 21/67* (2006.01)

(56)  References Cited

U.S. PATENT DOCUMENTS

| | | |
|---|---|---|
| 10,395,950 B2 | 8/2019 | Goshi et al. |
| 10,796,897 B2 | 10/2020 | Kiyohara |
| 10,825,698 B2 | 11/2020 | Cho et al. |
| 2016/0334162 A1 | 11/2016 | Kim et al. |
| 2018/0130675 A1* | 5/2018 | Goshi ............... H01L 21/02101 |

FOREIGN PATENT DOCUMENTS

| | | | |
|---|---|---|---|
| KR | 1020180064985 A | | 6/2018 |
| KR | 20190130974 A | * | 11/2019 |
| KR | 102075675 B1 | | 3/2020 |

* cited by examiner

WAFER PROCESSING EQUIPMENT AND METHOD OF MANUFACTURING SEMICONDUCTOR DEVICE

CROSS-REFERENCE TO THE RELATED APPLICATION

This application is based on and claims priority under 35 U.S.C. § 119 to Korean Patent Application No. 10-2021-0044297, filed on Apr. 5, 2021, in the Korean Intellectual Property Office, the disclosure of which is incorporated by reference herein in its entirety.

BACKGROUND

Embodiments of the present disclosure relate to wafer processing equipment and a method of manufacturing a semiconductor device.

To manufacture semiconductor devices, desired patterns may be formed in a wafer through various processes such as lithography, etching, ashing, ion implantation, and thin film deposition. Various processing solutions are used in each process, and contaminants such as particles may result from the process. To remove the contaminants, a process of cleaning the wafer may be performed before and/or after each process.

After the wafer is treated with a chemical and a rinse solution in a cleaning process, a dry process may be performed. In the dry process, the rinse solution remaining on the wafer may be removed using an organic solvent such as isopropyl alcohol (IPA). With the recent decrease in a critical dimension between patterns formed in a wafer, an organic solvent remains in a gap between the patterns. Therefore, to remove an organic solvent remaining on a wafer, a dry process is performed using a processing fluid in a supercritical fluid state.

SUMMARY

Embodiments of the present disclosure provide wafer processing equipment having enhanced reliability and a method of manufacturing a semiconductor device.

According to one or more embodiments of the present disclosure, a fluid supply device configured to supply a processing fluid to a wafer processing device that includes a chamber is provided. The fluid supply device includes: a reservoir configured to change the processing fluid into a supercritical fluid state; a wafer protecting device comprising a body configured to prevent a wafer in the chamber of the wafer processing device from being damaged by the processing fluid in the supercritical fluid state by receiving the processing fluid in the supercritical fluid state and limiting a speed of the processing fluid; and a fluid supply line configured to provide a path for the processing fluid between the reservoir and the wafer protecting device and a path for the processing fluid between the wafer protecting device and the wafer processing device, wherein a width of the body of the wafer protecting device, in a direction perpendicular to a flow direction of the processing fluid within the wafer protecting device, is greater than a diameter of the fluid supply line.

According to one or more embodiments of the present disclosure, a fluid supply device configured to supply a processing fluid to a wafer processing device that includes a chamber is provided. The fluid supply device includes: a reservoir configured to change the processing fluid into a supercritical fluid state; a wafer protecting device configured to prevent a wafer in the chamber of the wafer processing device from being damaged by the processing fluid in the supercritical fluid state by receiving the processing fluid in the supercritical fluid state and limiting a speed of the processing fluid; and a fluid supply line configured to provide a path for the processing fluid between the reservoir and the wafer protecting device and a path for the processing fluid between the wafer protecting device and the wafer processing device. The wafer protecting device includes an orifice structure connected to the fluid supply line, wherein the orifice structure includes: a first portion that has a diameter that is the same as a diameter of the fluid supply line; a second portion having a diameter that is smaller than the diameter of the fluid supply line; and a third portion having a diameter that is the same as the diameter of the first portion, and wherein the second portion is between the first portion and the third portion.

According to one or more embodiments of the present disclosure, wafer processing equipment is provided. The wafer processing equipment includes: a first processing device configured to develop a wafer; a second processing device comprising a chamber, the second processing device configured to dry the wafer using a processing fluid in a supercritical fluid state; and a fluid supply device configured to supply the processing fluid to the second processing device. The fluid supply device includes: a reservoir configured to change the processing fluid into the supercritical fluid state; a wafer protecting device comprising a body configured to prevent the wafer in the chamber of the second processing device from being damaged by the processing fluid in the supercritical fluid state by receiving the processing fluid in the supercritical fluid state and limiting a speed of the processing fluid; and a fluid supply line configured to provide a path for the processing fluid between the reservoir and the wafer protecting device and a path for the processing fluid between the wafer protecting device and the second processing device, the fluid supply line comprising a plurality of bends including a bend. The body of the wafer protecting device is further configured to prevent a pressure surge of the processing fluid supplied to the second processing device and is between the bend and the second processing device along the fluid supply line, the bend being closest to the second processing device among the plurality of bends.

According to one or more embodiments of the present disclosure, a method of manufacturing a semiconductor device is provided. The method includes: transporting a wafer to a first processing device; developing a photoresist layer on the wafer with a developer using the first processing device; transporting the wafer to a chamber of a second processing device; and removing the developer remaining on the wafer by supplying a processing fluid in a supercritical fluid state to the second processing device using a fluid supply device. The fluid supply device includes: a reservoir configured to change the processing fluid into the supercritical fluid state; a wafer protecting device that includes a body configured to prevent the wafer in the wafer processing device from being damaged by the processing fluid in the supercritical fluid state by receiving the processing fluid in the supercritical fluid state and limiting a speed of the processing fluid; and a fluid supply line configured to provide a path for the processing fluid between the reservoir and the wafer protecting device and a path for the processing fluid between the wafer protecting device and the second processing device, wherein the body of the wafer protecting device is further configured to prevent a pressure surge of the processing fluid supplied to the second processing device.

BRIEF DESCRIPTION OF THE DRAWINGS

Embodiments of the present disclosure will be more clearly understood from the following detailed description taken in conjunction with the accompanying drawings in which.

DETAILED DESCRIPTION

Figure 1:
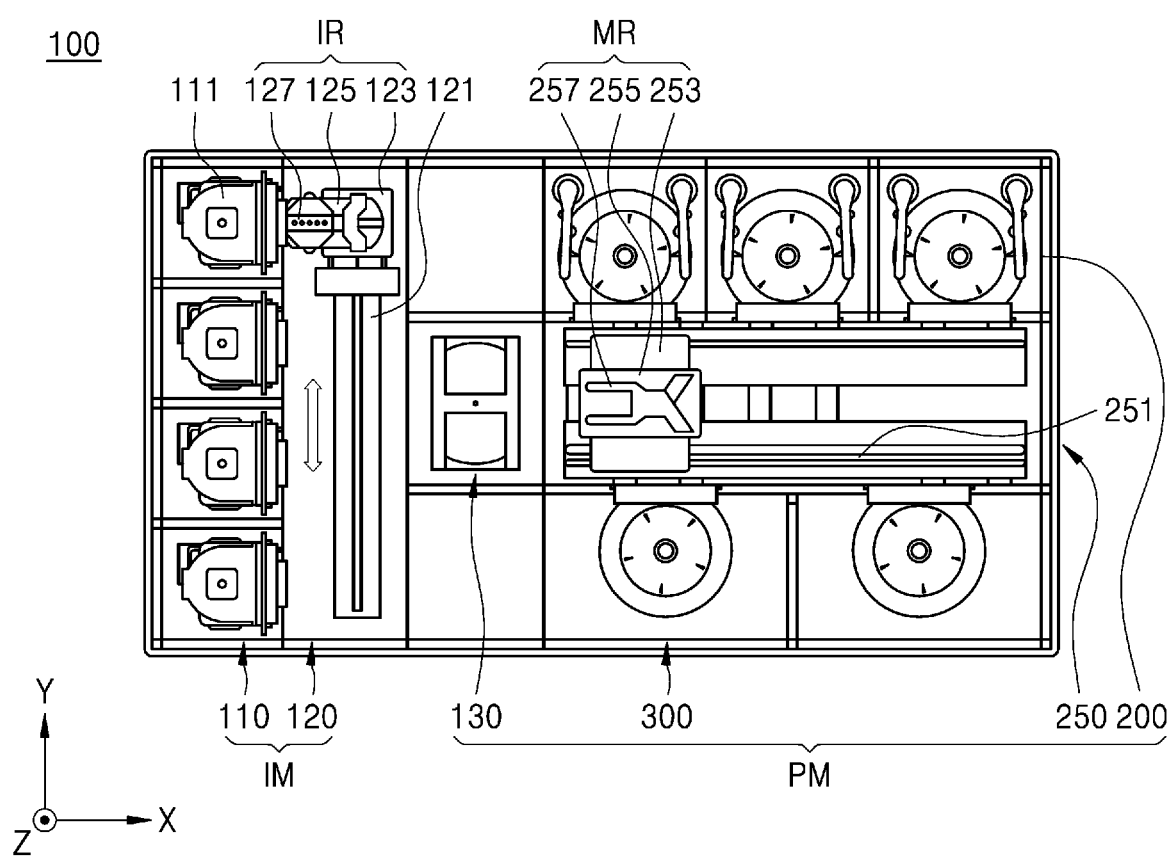
FIG. 1 is a plan view of wafer processing equipment according to an embodiment.

Hereinafter, non-limiting example embodiments of the present disclosure will be described in detail with reference to the accompanying drawings. In the drawing, like reference characters denote like elements, and redundant descriptions thereof will be omitted.

FIG. 1 is a plan view of wafer processing equipment 100 according to an embodiment.

Referring to FIG. 1, the wafer processing equipment 100 may include an index module IM and a processing module PM. The index module IM may include a load port 110 and a transport frame 120. The load port 110, the transport frame 120, and the processing module PM may be sequentially arranged in a line. Hereinafter, a direction in which the load port 110, the transport frame 120, and the processing module PM are arranged may be defined as an X direction; a direction perpendicular to the X direction may be defined as a Y direction; and a direction perpendicular to both the X and Y directions may be defined as a Z direction.

A carrier 111 accommodating a wafer is received in the load port 110. A plurality of the load port 110 may be arranged in a line in the Y direction. Although four of the load port 110 is illustrated in FIG. 1, the number of the load port 110 may be increased or decreased according to conditions such as the process efficiency and footprint of the processing module PM. The carrier 111 may include a plurality of slots each configured to support an edge of a wafer. The slots may be separated from each other in the Z direction, and accordingly, A plurality of wafers may be loaded in the carrier 111 to overlap each other in the Z direction. The carrier 111 may include a front opening unified pod (FOUP).

The processing module PM may include a buffer 130, a transport chamber 250, a plurality of a first processing device 200, and a plurality of a second processing device 300. The transport chamber 250 may extend in the X direction. The plurality of the first processing device 200 may be separated from the plurality of the second processing device 300 in the Y direction with the transport chamber 250 between the plurality of the first processing device 200 and the plurality of the second processing device 300. Some of the plurality of the first processing device 200 may be arranged in the X direction. Some of the plurality of the first processing device 200 may be stacked in the Z direction. In other words, the plurality of the first processing device 200 may be arranged in an A×B array at one side of the transport chamber 250, where A and B are natural numbers of at least 1. Here, A is the number of the plurality of the first processing device 200 arranged in a line in the X direction, and B is the number of the plurality of the first processing device 200 arranged in a line in the Z direction. For example, when four or six of the first processing device 200 is provided at one side of the transport chamber 250, the plurality of the first processing device 200 may be arranged in a 2×2 or 3×2 array.

Similarly to the plurality of the first processing device 200, the plurality of the second processing device 300 may be arranged in an M×N array, where M and N are natural numbers of at least 1. Here, M and N may respectively correspond to A and B.

The arrangements of the plurality of the first processing device 200 and the plurality of the second processing device 300 described above are merely examples, and the arrangement of the plurality of the first processing device 200 and the plurality of the second processing device 300 may be variously modified. For example, unlike the arrangement shown in FIG. 1, the plurality of the first processing device 200 and the plurality of the second processing device 300 may be provided as a one-story structure and provided together only at one side of the transport chamber 250.

The buffer 130 may be between the transport frame 120 and the transport chamber 250. The buffer 130 may provide a space, in which a wafer is stored, between the transport chamber 250 and the transport frame 120. The buffer 130 may include a plurality of slots, i.e., inner spaces, in which wafers are respectively stored. The slots may overlap with each other and be separated from each other in the Z direction. The buffer 130 may include an opening in each of a surface facing the transport frame 120 and a surface facing the transport chamber 250 such that a wafer enters the buffer 130 or exits from the buffer 130 through the opening.

The transport frame 120 may transport a wafer between the carrier 111 on the load port 110 and the buffer 130 of the processing module PM. The transport frame 120 may include an index rail 121 and an index robot IR. The index rail 121 may extend in the Y direction. The index robot IR may be mounted on the index rail 121 and move in a straight line in the Y direction along the index rail 121.

The index robot IR may include a base 123, a body 125, and index arms 127. The base 123 may move along the index rail 121. The body 125 may be coupled to the base 123 and move in the Z direction along with the base 123. The body 125 may be on the base 123 and rotate around the Z direction. The index arms 127 may be coupled to the body 125 and move back and forth with respect to the body 125. Each of the index arms 127 may be independently driven. The index arms 127 may be stacked in the Z direction. Some of the index arms 127 may transport a wafer from the processing module PM to the carrier 111, and the others of the index arms 127 may transport a wafer from the carrier 111 to the processing module PM. Accordingly, a particle generated from a wafer before a process is prevented from being attached to the wafer after the process when the index robot IR carries in and out the wafer.

The transport chamber 250 may transport a wafer among the buffer 130, the plurality of the first processing device 200, and the plurality of the second processing device 300. The transport chamber 250 may include a guide rail 251 and a main robot MR. The main robot MR may include a base 253, a body 255, and a main arm 257. The base 253, the body 255, and the main arm 257 may respectively perform similar functions to the base 123, the body 125, and the index arms 127. The guide rail 251 may extend in the X direction. The main robot MR may be mounted on the guide rail 251 and move in a straight line in the X direction along the guide rail 251.

The plurality of the first processing device 200 and the plurality of the second processing device 300 may sequentially perform processes on a single wafer. For example, after a development process is performed on a wafer in the plurality of the first processing device 200, a dry process may be performed on the wafer in the plurality of the second processing device 300. The development process may include a process of a portion of removing photoresist, which is exposed (or unexposed) by a radiation beam during an exposure process. The dry process may be performed using a processing fluid in a supercritical fluid state. According to example embodiments, a processing fluid in a supercritical fluid state may include carbon dioxide ($CO_2$).

Although not explicitly shown in FIG. 1, the wafer processing equipment 100 may further include a fluid supply device 400 described with reference to FIGS. 2 and 3.

The first processing device 200 may include a processing container, a spin chuck, a lifting device, and an injection device (e.g. an injector). The processing container may provide a space, in which wafer processing is performed, and include an open top. A development process may be performed by the plurality of the first processing device 200.

The spin chuck may be disposed in the processing container. The spin chuck may support and rotate a wafer during a process. The lifting device may vertically move the processing container in a straight line. As the processing container is vertically moved, the relative height of the processing container with respect to the spin chuck is changed. According to example embodiments, the lifting device may vertically move the spin chuck instead of the processing container. The injection device may supply a liquid (e.g., a developer) to a wafer. Hereinafter, the plurality of the second processing device 300 are described with reference to FIG. 2.

Figure 2:
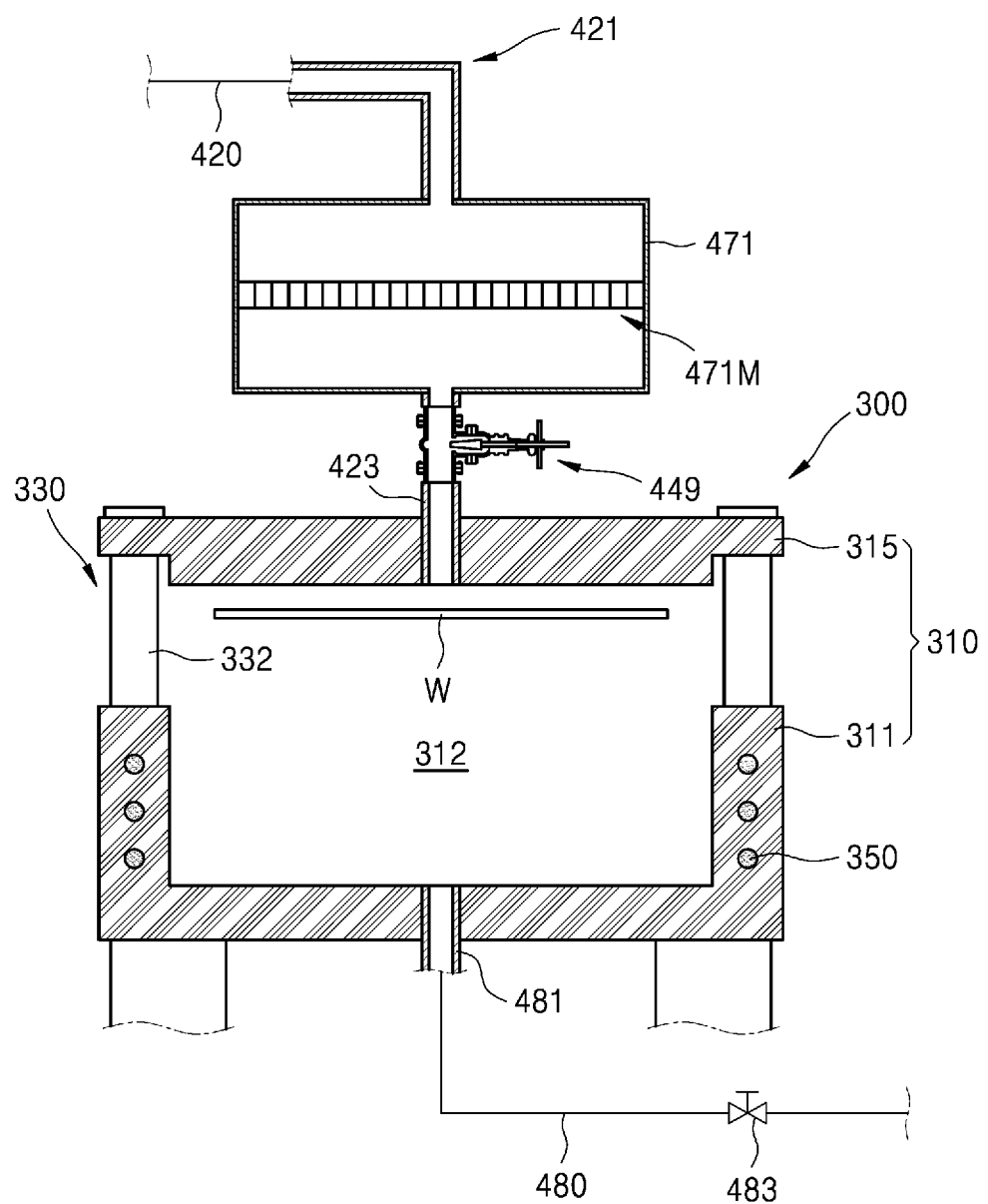
FIG. 2 is a schematic diagram of a second processing device and a portion of the peripheral configuration connected to the second processing device.

FIG. 2 is a schematic diagram of a second processing device 300 and a portion of the peripheral configuration connected to the second processing device 300.

Referring to FIG. 2, the second processing device 300 may include a high-pressure chamber 310, a body lifting device 330, and a heating device 350.

The high-pressure chamber 310 may provide a process space 312 for processing a wafer W. The high-pressure chamber 310 may seal the process space 312 from the outside while the wafer W is being processed. The high-pressure chamber 310 may include a lower body 311 and an upper body 315.

The upper body 315 and the lower body 311 may be coupled to each other so as to provide the process space 312. The upper body 315 may be above the lower body 311. The upper body 315 may have a quadrangular plate shape, and the lower body 311 may have a square cup shape having an open top. The upper body 315 and the lower body 311 may each include a metal.

A processing fluid in a supercritical fluid state may be supplied to the process space 312 through a supply port 423. For example, the supply port 423 may be at the center of the upper body 315. According to example embodiments, a processing fluid in a supercritical fluid state may be provided through at least two supply ports. In this case, in addition to the supply port 423 at the center of the upper body 315, additional supply ports may be connected to the upper body 315. The additional supply ports may be symmetrically (e.g., radial-symmetrically) arranged with respect to the supply port 423 at the center of the upper body 315. For example, additional supply ports may be at positions in a circle surrounding the supply port 423.

According to example embodiments, an additional supply port may be further provided in the lower body 311. In this case, a fluid supply line 420, which is described in detail with reference to FIG. 3, may branch to be connected to the supply port 423 and the additional supply port provided in the lower body 311. A fluid control valve may be provided to each of a branch of the fluid supply line 420 connected to the supply port 423 of the upper body 315 and another branch of the fluid supply line 420 connected to the supply port of the lower body 311. An exhaust port 481 may provide a passage, through which a processing fluid in a supercritical fluid state is discharged from the process space 312. The exhaust port 481 may be at the center of the lower body 311.

When a lower supply port is formed in the lower body 311, the lower supply port may be located to not interfere with the exhaust port 481. For example, when the exhaust port 481 is at the horizontal center of the lower body 311, the lower supply port may be separated from the center by a certain distance.

A substrate support, which supports the wafer W, may be provided in the process space 312. The substrate support may support the wafer W such that a processed surface of the wafer W faces the supply port 423.

The body lifting device 330 may control the relative position between the upper body 315 and the lower body 311. The body lifting device 330 may vertically move either the upper body 315 or the lower body 311. For example, the position of the upper body 315 may be fixed while the lower body 311 is moved by the body lifting device 330, or the position of the lower body 311 may be fixed while the upper body 315 is moved by the body lifting device 330.

The body lifting device 330 may move the lower body 311 such that the relative position between the upper body 315 and the lower body 311 changes between an open position and a sealed position. Here, the open position may be defined as a position, in which the lower body 311 is separated from the upper body 315 such that the process space 312 is open to the outside. The sealed position may be defined as a position, in which the lower body 311 is in contact with the upper body 315 such that the process space 312 is sealed from the outside.

The body lifting device 330 may include a plurality of lifting shafts 332 connecting the upper body 315 to the lower body 311. The lifting shafts 332 may be between the top end of the lower body 311 and the upper body 315. The lifting shafts 332 may be arranged along the edge of the top end of the lower body 311. Each of the lifting shafts 332 may pass through the upper body 315 and be fixedly coupled to the top end of the lower body 311. As the lifting shafts 332 vertically move, the distance between the upper body 315 and the lower body 311 may be controlled.

The heating device 350 may heat the process space 312. The heating device 350 may heat a processing fluid supplied to the process space 312 to a temperature that is higher than or equal to a threshold temperature to maintain the processing fluid in a supercritical fluid state. The heating device 350 may be provided inside the wall of at least one selected from the upper body 315 and the lower body 311. For example, the heating device 350 may include an electric heater, which externally receives electric power and generates heat.

An exhaust valve 483 adjacent to the exhaust port 481 may control the exhaust of the process space 312. A liquid (e.g., a developer) applied to the wafer W is mixed and diluted with a high-pressure processing fluid, which flows to the wafer W, and is removed by the flow of the processing fluid from the central portion of the wafer W to the edge thereof. The liquid (e.g., the developer) removed from the wafer W may be discharged through the exhaust port 481 together with a high-pressure fluid.

Figure 3:
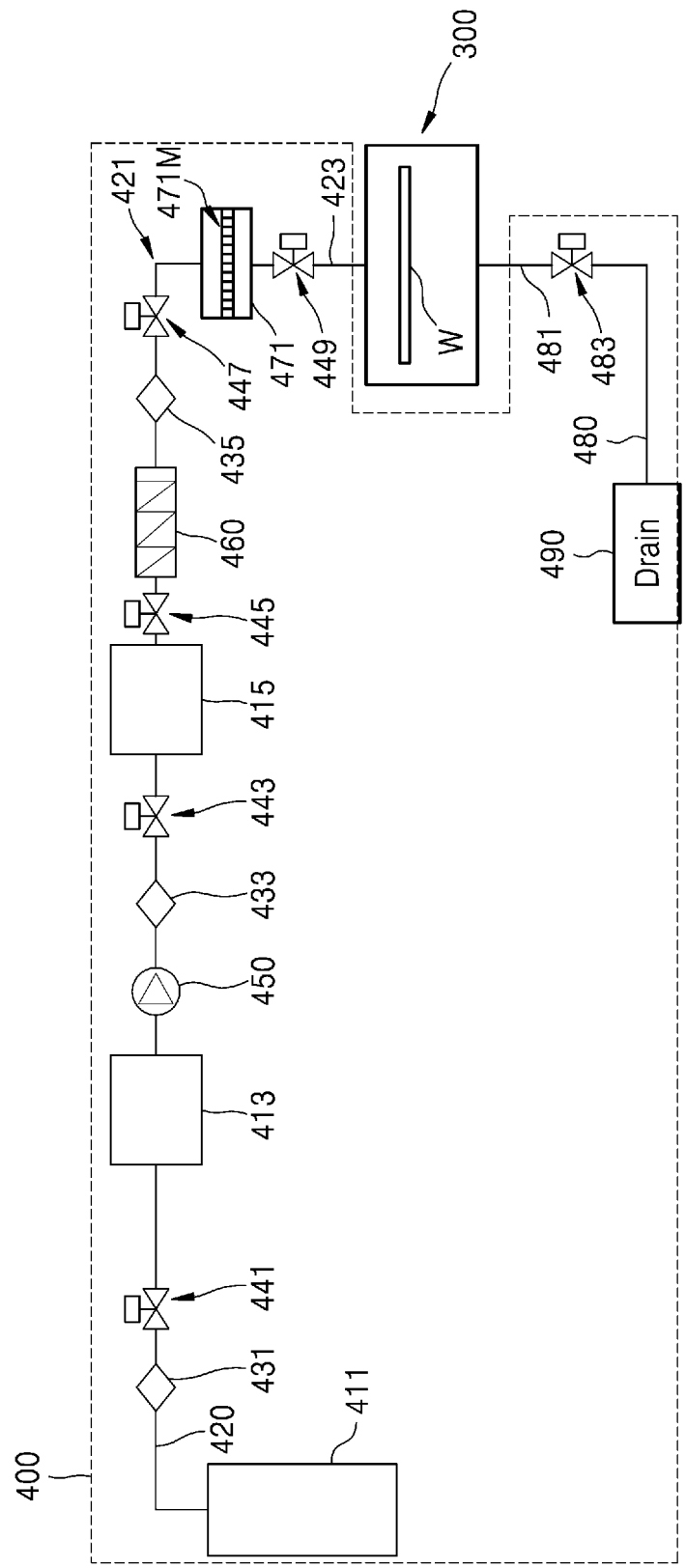
FIG. 3 is a schematic diagram of a fluid supply device.

FIG. 3 is a schematic diagram of a fluid supply device 400.

Referring to FIGS. 2 and 3, the fluid supply device 400 may supply a processing fluid to the second processing device 300. A processing fluid in a supercritical fluid state may be supplied to the second processing device 300. The fluid supply device 400 may include a fluid supply tank 411, a condenser 413, a reservoir 415, the fluid supply line 420, a first filter 431, a second filter 433, a third filter 435, a first valve 441, a second valve 443, a third valve 445, a fourth valve 447, a fifth valve 449, a pump 450, a heating device 460, a wafer protecting device 471, a fluid discharge line 480, the exhaust valve 483, and a drain 490.

The fluid supply line 420 may provide a path for supplying a processing fluid to the second processing device 300. For example, the fluid supply line 420 may include a pipe. According to example embodiments, the fluid supply line 420 may have a diameter of about ¼ inch to about 1 inch. The fluid supply tank 411, the first filter 431, the first valve 441, the condenser 413, the pump 450, the second filter 433, the second valve 443, the reservoir 415, the third valve 445, the heating device 460, the third filter 435, the fourth valve 447, the wafer protecting device 471, and the fifth valve 449 may be sequentially provided in the fluid supply line 420 according to a direction in which a processing fluid is supplied. The fluid discharge line 480 may provide a path for discharging a fluid that has been used to process the wafer W. The exhaust valve 483 and the drain 490 may be sequentially provided in the fluid discharge line 480.

Each of the first valve 441, the second valve 443, the third valve 445, the fourth valve 447, and the fifth valve 449 may be provided in the fluid supply line 420 to control the flow of a processing fluid at a position thereof in the fluid supply line 420. For example, each of the first valve 441, the second valve 443, the third valve 445, the fourth valve 447, and the fifth valve 449 may include an automatic valve, which is controlled by an electronic signal to be opened and closed. According to example embodiments, the fifth valve 449 may be kept open.

The first filter 431, the second filter 433, and the third filter 435 may filter out impurities in a processing fluid in a supercritical fluid state.

The condenser 413 may change the phase of a processing fluid. The condenser 413 may cool down the processing fluid such that the processing fluid is changed from a liquid phase to a gas phase.

The pump 450 may drive the processing fluid, which has been liquefied by the condenser 413, to be supplied to the second processing device 300 through the fluid supply line 420.

The reservoir 415 may store the processing fluid and change a phase of the processing fluid into a supercritical fluid. The reservoir 415 may heat the processing fluid through a heater embedded therein. The heater may heat the processing fluid to a temperature that is higher than or equal to the threshold temperature of the processing fluid. Accordingly, the processing fluid discharged from the reservoir 415 may be in a state supercritical fluid.

The heating device 460 may securely maintain the processing fluid to be in the supercritical fluid state by heating the processing fluid, which is discharged from the reservoir 415 and flows through the fluid supply line 420.

The fluid supply line 420 may include at least one bend 421 due to space constraint. The bend 421 of the fluid supply line 420 may cause the speed distribution of the processing fluid, which flows through the fluid supply line 420 in the supercritical fluid state, to be non-uniform. When the processing fluid having a non-uniform speed distribution is supplied to the top surface of the wafer W, a thin film and/or a pattern formed in the top surface of the wafer W may be damaged.

In addition, when the fourth valve 447 is opened or closed, a water hammer, i.e., a pressure surge or a shock wave, which is caused by a sudden flow of the processing fluid, may occur. In general, a pressure surge is alleviated by slowing down the opening/closing speed of a valve. However, high-pressure valves such as the first valve 441, the second valve 443, the third valve 445, and the fourth valve 447 are instantaneously opened or closed, and accordingly, it may be practically impossible to prevent a pressure surge by operating a high-pressure valve.

As described above, when a high-pressure processing fluid flows into the second processing device 300 at an initial atmospheric pressure to remove a liquid (e.g., a developer) from the surface of the wafer W, the liquid (e.g., the developer) applied to the wafer W is pushed and dried by the high-speed processing fluid out of the wafer W. When the processing fluid flows excessively fast dewetting occurs such that a liquid (e.g., a developer) layer is dried before a surface tension is sufficiently decreased, and thus leaning damage may occur to a pattern (e.g., a photoresist pattern) on the wafer W.

According to example embodiments, the wafer protecting device 471 may be provided between the bend 421 of the fluid supply line 420, which is most adjacent to the second processing device 300, and the second processing device 300. Only a supply port 423 having a linear shape of the fluid supply line 420, which extends in a straight line (i.e., without a bend), may be between the wafer protecting device 471 and the second processing device 300. Accordingly, a processing fluid may be supplied to the surface of the wafer W at a uniform mass flow rate, and damage to a pattern and a thin film of the wafer W may be prevented.

In addition, due to the relatively large volume of the wafer protecting device 471, the speed of a processing fluid flowing into the second processing device 300 may be limited to be less than a speed (hereinafter, referred to as a dewetting speed), at which dewetting of a liquid (e.g., a developer) layer occurs. Accordingly, a thin film and/or pattern of the wafer W may be prevented from being damaged, and the reliability of semiconductor manufacturing processes may be enhanced.

According to example embodiments, the width (e.g., diameter) of the wafer protecting device 471 may be greater than the diameter of the fluid supply line 420. According to example embodiments, the width (e.g., diameter) of the wafer protecting device 471 may be greater than about ½ inch. According to example embodiments, the wafer protecting device 471 may have a sufficient volume to prevent the surge of a pressure at which a processing fluid is supplied. According to example embodiments, the volume of the wafer protecting device 471 may range from about 20% to about 200% of the volume of the second processing device 300.

The wafer protecting device 471 may include a mesh plate 471M of a flat type. The mesh plate 471M may include a plurality of holes. According to some embodiments, the holes of the mesh plate 471M may have an orifice structure. The orifice structure of the holes of the mesh plate 471M may be similar to that described below with reference to FIG. 11 but have a relatively small size. According to example embodiments, the holes of the mesh plate 471M may have a constant diameter. The mesh plate 471M may make the mass flow of a processing fluid, which passes through the wafer protecting device 471, further uniform and limit the speed of the processing fluid, which flows into the second processing device 300, to below the dewetting speed.

According to example embodiments, the holes of the mesh plate 471M may be uniformly formed in the entire surface of the mesh plate 471M. According to example embodiments, the holes of the mesh plate 471M may be non-uniformly formed in the entire surface of the mesh plate 471M. For example, the density of holes in the central portion of the mesh plate 471M may be higher than that in the edge portion of the mesh plate 471M, or the density of holes in the edge portion of the mesh plate 471M may be higher than that in the central portion of the mesh plate 471M.

Although it is illustrated in FIGS. 2 and 3 that the wafer protecting device 471 includes one mesh plate 471M, this is just an example and embodiments are not limited thereto. For example, the wafer protecting device 471 may include at least two of the mesh plate 471M or may not include the mesh plate 471M.

Figure 4A:
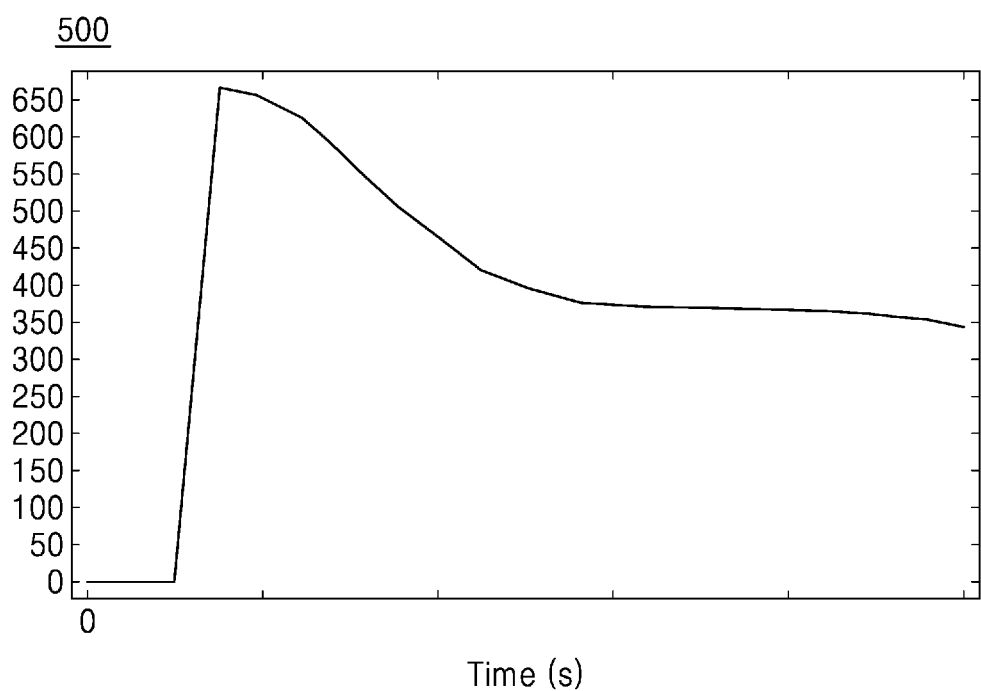
FIG. 4A is a graph for describing the effect of a wafer processing device according to related art.
Figure 4B:
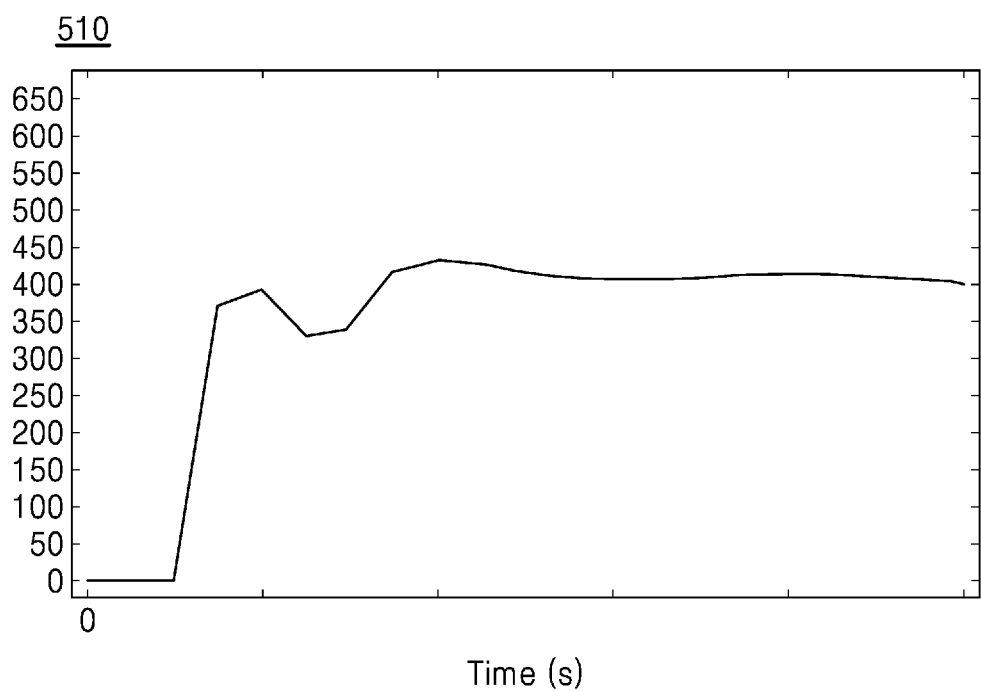
FIG. 4B is a graph for describing the effect of a wafer processing device according to example embodiments.

FIG. 4A is a graph 500 showing a change in the speed (m/s) of a processing fluid, which flows into a wafer processing device according to the related art after a valve of the wafer processing device is opened, over time. FIG. 4B is a graph 510 showing a change in the speed (m/s) of a processing fluid, which flows into a wafer processing device according to example embodiments after a valve of the wafer processing device is opened, over time.

Referring to FIG. 4A, it is seen that the maximum speed of a processing fluid in a supercritical fluid state is about 660 m/s due to a pressure surge after the valve is opened.

In contrast, referring to FIG. 4B, it is confirmed that after the valve is opened, the maximum speed of a processing fluid in a supercritical fluid state is about 425 m/s, which is 38% lower than that of the example of the related art. Accordingly, a thin film and/or a pattern of a wafer may be prevented from being damaged due to a sudden rise in pressure after a valve is opened.

Figure 5:
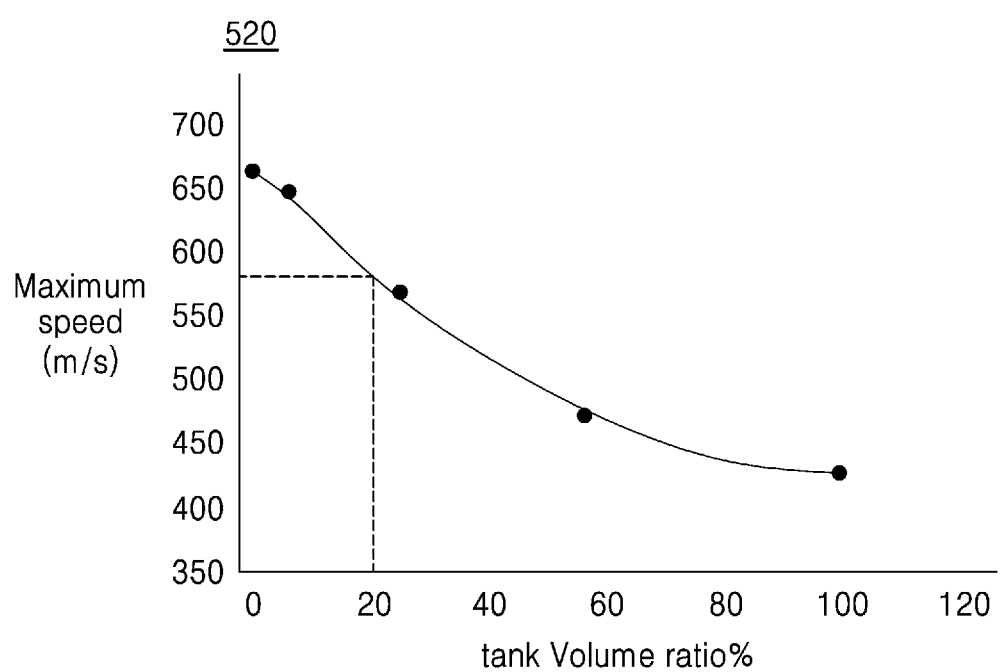
FIG. 5 is a graph for describing the effect of a wafer processing device according to example embodiments.

FIG. 5 is a graph 520 for describing the effect of a wafer processing device according to example embodiments.

In FIG. 5, the horizontal axis indicates, as a percentage, a value that is obtained by dividing the volume of the wafer protecting device 471 (in FIG. 2) by the volume of the second processing device 300 (in FIG. 2). In FIG. 5, the vertical axis is a maximum speed of a processing fluid, which is in a supercritical fluid state after a valve is opened, with respect to each volume of the wafer protecting device 471.

Referring to FIG. 5, it is confirmed that when the volume of the wafer protecting device 471 is at least 20% of the volume of the second processing device 300, the maximum speed of a processing fluid in a supercritical fluid state after a valve is opened is 580 m/s or lower. According to example embodiments, when the volume of the wafer protecting device 471 is about 20% to about 200% of the volume of the second processing device 300, the maximum speed of a processing fluid in a supercritical fluid state after a valve is opened may be limited to 500 m/s or lower, and accordingly, the reliability of semiconductor manufacturing processes may be enhanced.

FIGS. 6A through 6D are respectively cross-sectional views of a wafer protecting device 471a, a wafer protecting device 471b, a wafer protecting device 471c, and a wafer protecting device 471d, according to example embodiments. In FIGS. 6A through 6D, solid line arrows indicate the substantial flow direction of a processing fluid.

Figure 6A:
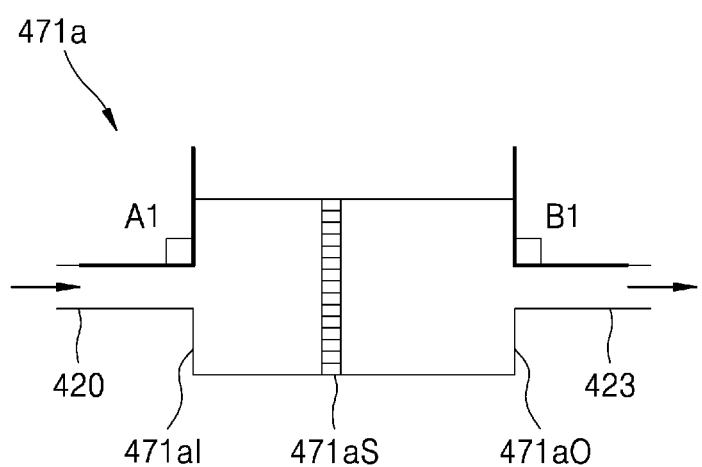
FIG. 6A is cross-sectional view of a wafer protecting device according to an example embodiment.

Referring to FIG. 6A, the wafer protecting device 471a may include an input surface 471aI through which a processing fluid flows into the wafer protecting device 471a, an output surface 471aO through which the processing fluid is discharged from the wafer protecting device 471a, and a side surface 471aS connecting the input surface 471aI to the output surface 471aO.

According to example embodiments, the wafer protecting device 471a may be rotationally symmetrical with respect to an axis that is parallel with the substantial flow direction of a processing fluid. According to example embodiments, each of the input surface 471aI and the output surface 471aO may be perpendicular to the substantial flow direction of a processing fluid. According to example embodiments, the wafer protecting device 471a may substantially have a cylindrical shape. However, embodiments are not limited thereto. The wafer protecting device 471a may have various prismatic shapes such as a triangular pillar, a quadrangular pillar, and so on. According to example embodiments, an input angle A1 between the input surface 471aI and the fluid supply line 420 may be about 90 degrees, and an output angle B1 between the output surface 471aO and the fluid supply line 420 may be about 90 degrees.

Figure 6B:
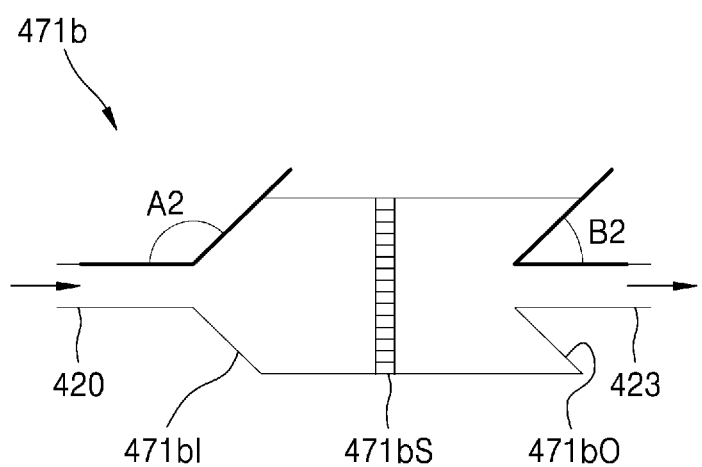
FIG. 6B is cross-sectional view of a wafer protecting device according to an example embodiment.

Referring to FIG. 6B, the wafer protecting device 471b may include an input surface 471bI through which a processing fluid flows into the wafer protecting device 471b, an output surface 471bO through which the processing fluid is discharged from the wafer protecting device 471b, and a side surface 471bS connecting the input surface 471bI to the output surface 471bO.

According to example embodiments, the wafer protecting device 471b may be rotationally symmetrical with respect to an axis that is parallel with the substantial flow direction of a processing fluid. According to example embodiments, each of the input surface 471bI and the output surface 471bO may be oblique to the substantial flow direction of a processing fluid. According to example embodiments, an input angle A2 between the input surface 471bI and the fluid supply line 420 may be greater than or equal to about 90 degrees and less than or equal to about 180 degrees, and an output angle B2 between the output surface 471bO and the fluid supply line 420 may be greater than or equal to about 0 degrees and less than or equal to about 90 degrees. According to example embodiments, the sum of the input angle A2 and the output angle B2 may be about 180 degrees but is not limited thereto.

Figure 6C:
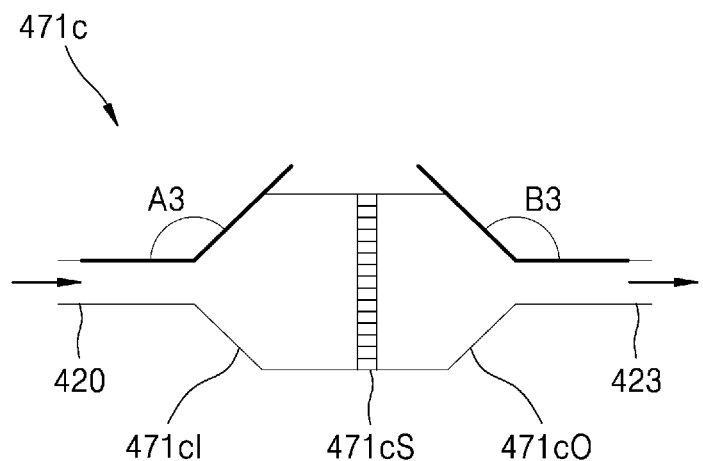
FIG. 6C is cross-sectional view of a wafer protecting device according to an example embodiment.

Referring to FIG. 6C, the wafer protecting device 471c may include an input surface 471cI through which a processing fluid flows into the wafer protecting device 471c, an output surface 471cO through which the processing fluid is discharged from the wafer protecting device 471c, and a side surface 471cS connecting the input surface 471cI to the output surface 471cO.

According to example embodiments, the wafer protecting device 471c may be rotationally symmetrical with respect to an axis that is parallel with the substantial flow direction of a processing fluid. According to example embodiments, each of the input surface 471cI and the output surface 471cO may be oblique to the substantial flow direction of a processing fluid. According to example embodiments, an input angle A3 between the input surface 471cI and the fluid supply line 420 may be greater than or equal to about 90 degrees, and an output angle B3 between the output surface 471cO and the fluid supply line 420 may be greater than or equal to about 90 degrees.

Figure 6D:
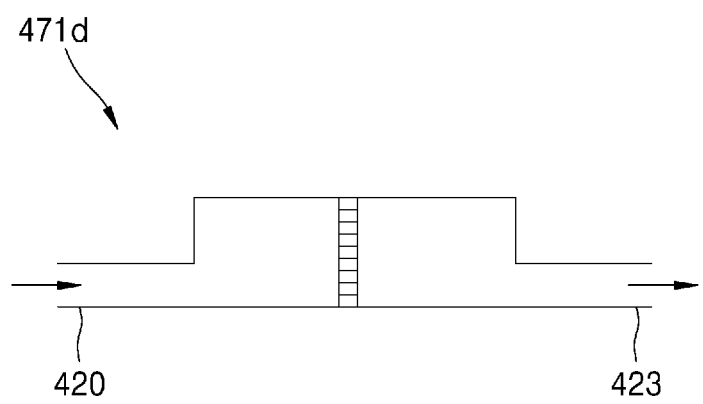
FIG. 6D is cross-sectional view of wafer protecting device according to an example embodiment.

Referring to FIG. 6D, the wafer protecting device 471d may have a similar shape to the wafer protecting device 471a of FIG. 6A but may have a volume increased in one direction with respect to the fluid supply line 420, according to the cross-sectional view. According to example embodiments, the wafer protecting device 471d may be rotationally asymmetrical with respect to an axis that is parallel with the substantial flow direction of a processing fluid. According to example embodiments, the wafer protecting device 471d may save a space when wafer processing equipment is installed, and accordingly, the design freedom of the fluid supply line 420 may be enhanced.

Figure 7:
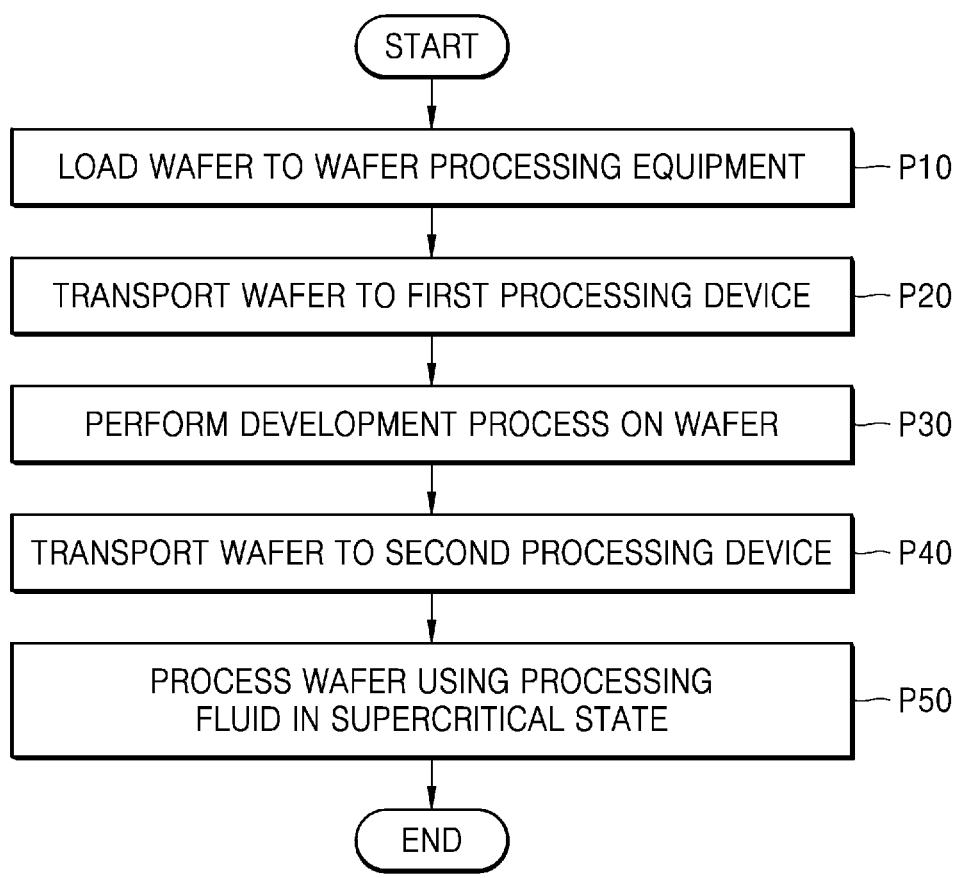
FIG. 7 is a flowchart of a method of manufacturing a semiconductor device, according to example embodiments.

FIG. 7 is a flowchart of a method of manufacturing a semiconductor device, according to example embodiments.

Referring to FIGS. 1 and 7, a wafer may be loaded to the wafer processing equipment 100 in operation P10.

Here, the wafer may include a photoresist layer that has undergone an exposure process. A material of the photoresist layer may be sensitive to an ultraviolet (UV) ray, a deep UV (DUV) ray, an extreme UV (EUV) ray, an excimer laser beam, an X-ray, or an electron beam. When an EUV exposure process is used, a material having a high EUV absorption rate may be required because the number of photons during the EUV exposure process is less than that during a DUV exposure process or the like. Accordingly, an EUV photoresist material may include, for example, hydroxystyrene. Furthermore, iodophenol may be provided, as an additive, to EUV photoresist.

According to some embodiments, the thickness of the photoresist layer may range from about 0.1 µm to about 2 µm. According to some embodiments, the thickness of the photoresist layer may range from about 200 nm to about 600 nm. In the case of EUV photoresist, a photoresist layer may be made thin by spin-coating a photoresist solution with a low concentration.

When a layer to be etched is thick, a hard mask layer including amorphous carbon may be further provided below photoresist. According to some embodiments, the hard mask layer may further include fluorine. When the hard mask layer includes fluorine, the EUV sensitivity of photoresist may be enhanced. In addition, an anti-reflective layer may be further provided between the hard mask layer and the photoresist.

Radiation beams used for an exposure process may include a UV ray, a DUV ray, an EUV ray, an excimer laser beam, an X-ray, and an electron beam. According to example embodiments, the wavelength of EUV radiation may range from about 4 nm to about 124 nm. According to example embodiments, the wavelength of EUV radiation may range from about 5 nm to about 20 nm. According to example embodiments, the wavelength of EUV radiation may range from about 13 nm to about 14 nm. According to example embodiments, the wavelength of EUV radiation may be about 13.5 nm.

A radiation beam may pass through a photomask and reach a photoresist layer. Positive photoresist exposed to the radiation beam may be chemically modified. In some embodiments, the photomask may be referred to as a reticle and may include a material (e.g., chromium (Cr)), which does not transmit a radiation beam and is formed above or below a glass layer that may transmit the radiation beam.

A radiation system for generating EUV radiation may include a laser, which excites a plasma source to provide plasma, and a source collector module, which stores the plasma. For example, plasma may be generated by radiating a laser beam to a plasma source such as a tin particle, xenon (Xe) gas, or lithium (Li) vapor. This radiation system is usually referred to as a laser produced plasma (LPP) source. An alternative source includes a discharge plasma source or a source based on synchrotron radiation provided by an electron storage ring.

In general, an exposure process using an EUV radiation beam may be performed using reduction projection (for example, having a 4:1 reduction ratio). Because a mask pattern is reduced to about ¼ size thereof and then mapped to a semiconductor wafer, a full shot may correspond to about ¼ of the original size of the mask pattern. Here, ¼ is a reduction ratio in length, and a reduction ratio in area may be ¹⁄₁₆. Accordingly, a pattern formed in a lithography mask has a greater critical dimension than a pattern mapped to an actual wafer, and therefore, the reliability of a lithography process may be enhanced.

Here, the exposure process may be classified into a scan mode performing continuous shooting and a step mode performing shooting step by step. In general, an EUV exposure process is performed in a scan mode, and an EUV exposure device is usually called a scanner. Scanning of an EUV exposure device may be performed using a slit that limits light to a partial region of a mask. The slit may limit light in an apparatus, which performs an EUV exposure process, such that the light is uniformly radiated to an EUV photomask. Light may be continuously radiated to a mask by radiating the light to a limited region of the mask through a slit while moving the mask in an opposite direction to a scan direction. A region, to which light is radiated in a test wafer via scanning of the entire region of a mask as described above, may correspond to a full shot.

According to some embodiments, a photomask may include an EUV photomask. According to some embodiments, a photomask may include a silicon wafer and a plurality of silicon layers and molybdenum layers alternating with each other on the silicon wafer. The photomask may further include a ruthenium (Ru)-containing layer on the stack of alternating silicon and molybdenum layers. A layout pattern including a tantalum boron nitride (TaBN)-containing layer and a lawrencium-containing layer may be formed on the Ru-containing layer. The various materials and layers described herein with respect to an EUV photomask are just examples, and embodiments are not limited thereto.

Subsequently, the wafer may be transported to a first processing device 200 in operation P20. The transport to the first processing device 200 may be performed by the index robot IR and the main robot MR.

Subsequently, a development process may be performed on the wafer in operation P30. The development process may be performed by the first processing device 200, as described above with reference to FIG. 1.

Subsequently, the wafer may be transported to a second processing device 300 in operation P40. The transport to the second processing device 300 may be performed by the main robot MR.

Subsequently, the wafer may be processed using a processing fluid in a supercritical fluid state in operation P50, as described above with reference to FIGS. 1, 2, and 7. The processing of the wafer using a processing fluid in a supercritical fluid state may correspond to the dry process described with reference to FIG. 1 and may be performed by the second processing device 300.

After the wafer is processed using a processing fluid in a supercritical fluid state, a hard-bake process may be further performed on the wafer. The hard-bake process removes moisture and solvent, which remain after the development process, thereby increasing an adhesive strength between the photoresist pattern and the wafer. According to example embodiments, the hard-bake process may be performed by a bake device included in the wafer processing equipment 100 or a bake device outside the wafer processing equipment 100.

Figure 8:
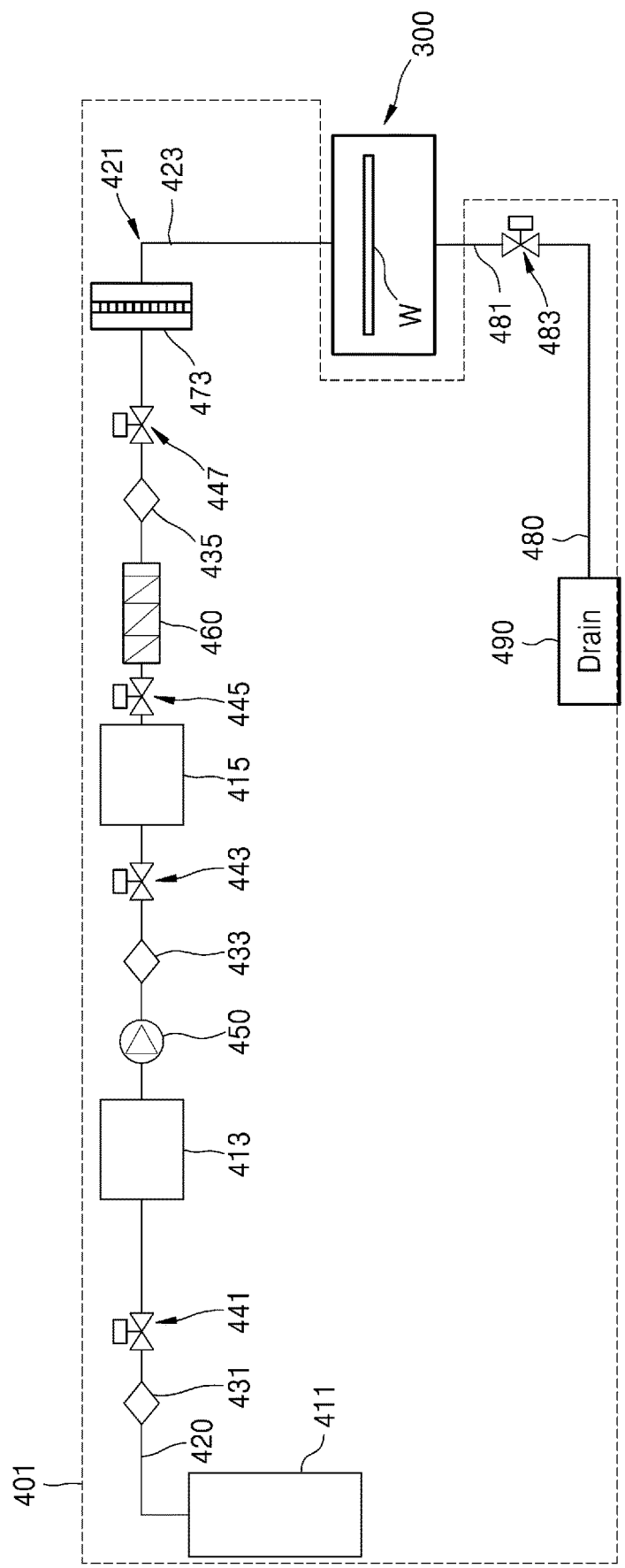
FIG. 8 is a schematic diagram of a fluid supply device according to an example embodiment.

FIG. 8 is a schematic diagram of a fluid supply device 401 according to example embodiments.

For convenience of description, redundant descriptions given above with reference to FIG. 3 will be omitted, and descriptions below will be focused on differences.

Referring to FIG. 8, the fluid supply device 401 may include the fluid supply tank 411, the condenser 413, the reservoir 415, the fluid supply line 420, the first filter 431, the second filter 433, the third filter 435, the first valve 441, the second valve 443, the third valve 445, the fourth valve 447, the pump 450, the heating device 460, a wafer protecting device 473, the fluid discharge line 480, the exhaust valve 483, and the drain 490.

Unlike the fluid supply device 400 of FIG. 3, the fluid supply device 401 may include the wafer protecting device 473, which is separated from the second processing device 300 with the bend 421 between the wafer protecting device 473 and the second processing device 300. According to example embodiments, the wafer protecting device 473 may be closest to the bend 421, which is most adjacent to the second processing device 300, in the fluid supply device 401.

According to example embodiments, when the wafer protecting device 473 is located to be close to the bend 421 that is most adjacent to the second processing device 300, both the design freedom of the fluid supply device 401 and the reliability of semiconductor manufacturing processes may be enhanced.

Figure 9:
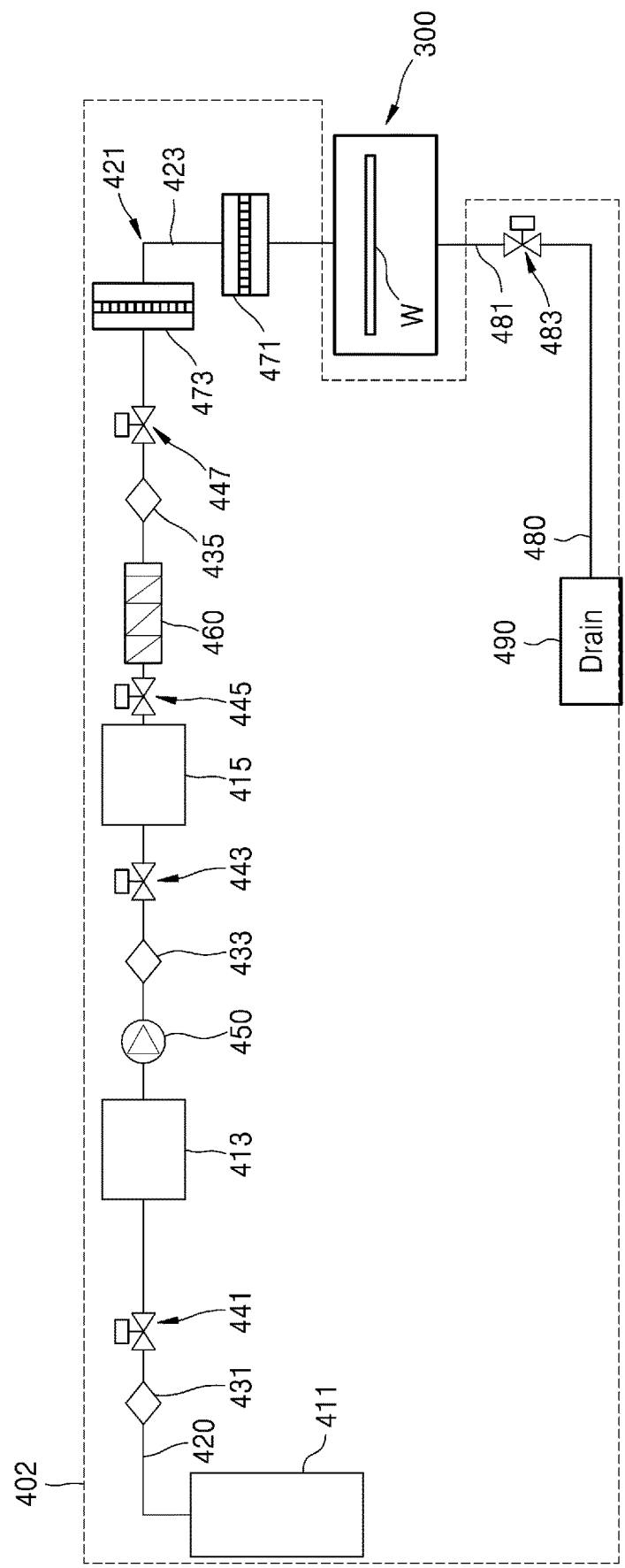
FIG. 9 is a schematic diagram of a fluid supply device according to an example embodiment.

FIG. 9 is a schematic diagram of a fluid supply device 402 according to example embodiments.

For convenience of description, redundant descriptions given above with reference to FIG. 3 will be omitted, and descriptions below will be focused on differences.

Referring to FIG. 9, the fluid supply device 402 may include the fluid supply tank 411, the condenser 413, the reservoir 415, the fluid supply line 420, the first filter 431, the second filter 433, the third filter 435, the first valve 441, the second valve 443, the third valve 445, the fourth valve 447, the pump 450, the heating device 460, the wafer protecting device 471, the wafer protecting device 473, the fluid discharge line 480, the exhaust valve 483, and the drain 490.

Unlike the fluid supply device 400 of FIG. 3 and the fluid supply device 401 of FIG. 8, the fluid supply device 402 may include at least two wafer protecting devices (e.g. wafer protecting device 471 and the wafer protecting device 473), and accordingly, the reliability of semiconductor manufacturing processes may be enhanced.

Figure 10:
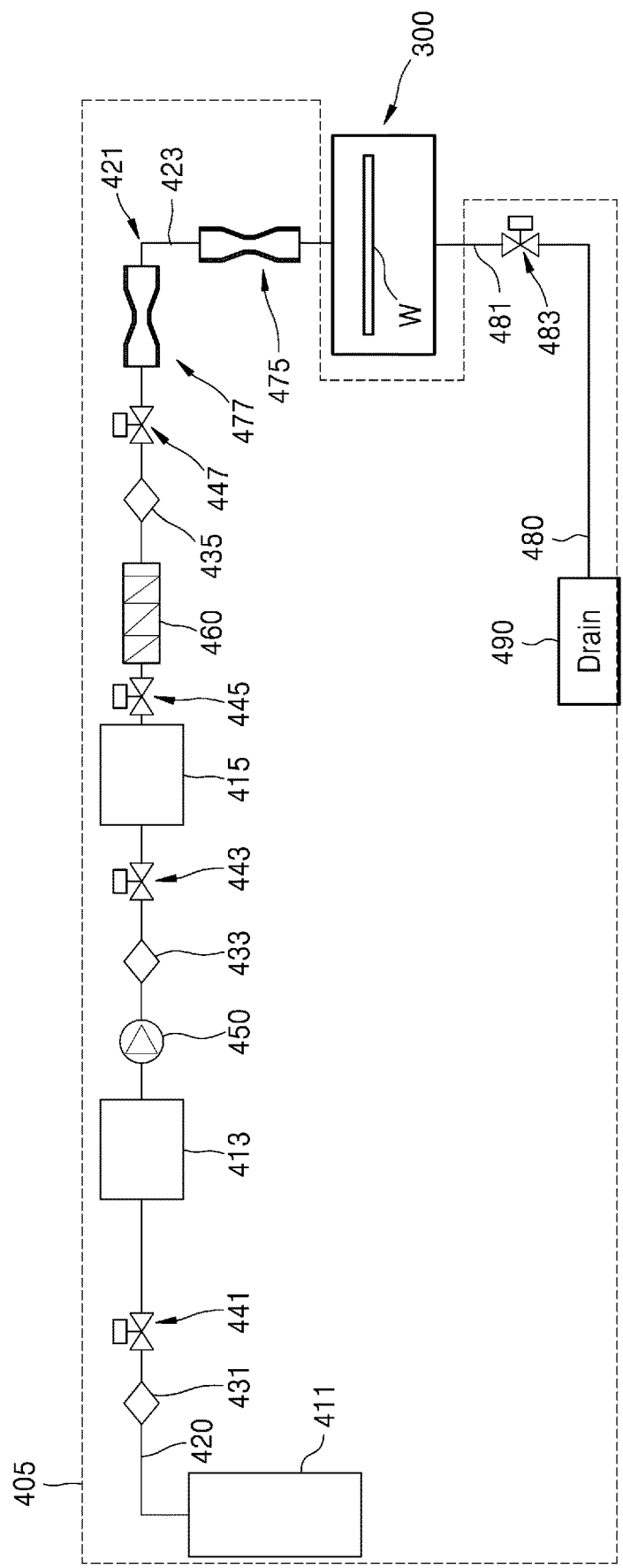
FIG. 10 is a schematic diagram of a fluid supply device according to an example embodiment.

FIG. 10 is a schematic diagram of a fluid supply device 405 according to example embodiments.

For convenience of description, redundant descriptions given above with reference to FIG. 3 will be omitted, and descriptions below will be focused on differences.

Referring to FIG. 10, the fluid supply device 405 may include the fluid supply tank 411, the condenser 413, the reservoir 415, the fluid supply line 420, the first filter 431, the second filter 433, the third filter 435, the first valve 441, the second valve 443, the third valve 445, the fourth valve 447, the pump 450, the heating device 460, wafer protecting device 475, wafer protecting device 477, the fluid discharge line 480, the exhaust valve 483, and the drain 490.

Each of the wafer protecting device 475 and the wafer protecting device 477 may have an orifice structure. The wafer protecting device 475 may be provided at the same position as the wafer protecting device 471 in FIG. 9, and the wafer protecting device 477 may be provided at the same position as the wafer protecting device 473 in FIG. 9.

According to example embodiment, one of the wafer protecting device 475 and the wafer protecting device 477 may be omitted. For example, the fluid supply device 405 may include either the wafer protecting device 475 or the wafer protecting device 477.

According to example embodiment, the wafer protecting device 475 having an orifice structure is smaller than the wafer protecting device 471 in FIG. 3, and accordingly, both the design freedom of the fluid supply device 405 and the reliability of semiconductor manufacturing processes may be enhanced.

Figure 11:
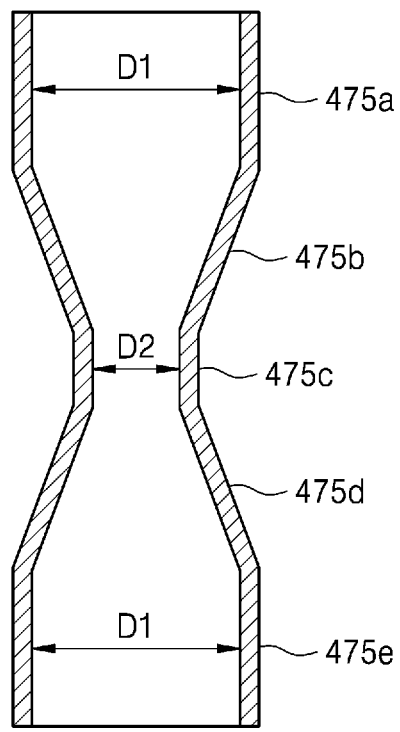
FIG. 11 is a cross-sectional view of the structure of a wafer protecting device in FIG. 10.

FIG. 11 is a cross-sectional view of the structure of a wafer protecting device 475 in FIG. 10.

Referring to FIG. 11, the wafer protecting device 475 may include a first portion 475*a*, a second portion 475*b*, a third portion 475*c*, a fourth portion 475*d*, and a fifth portion 475*e*. In FIG. 11, a processing fluid may flow into the wafer protecting device 475 through the first portion 475*a* and flow out of the wafer protecting device 475 through the fifth portion 475*e*.

Each of the first portion 475*a*, the third portion 475*c*, and the fifth portion 475*e* may substantially have a constant diameter. Each of the second portion 475*b* and the fourth portion 475*d* may have a diameter that changes along the flow direction of a processing fluid. The second portion 475*b* may be connected to the first portion 475*a* and the third portion 475*c*. The fourth portion 475*d* may be connected to the third portion 475*c* and the fifth portion 475*e* For example, the second portion 475*b* may have a diameter that decreases along the flow direction of a processing fluid, and the fourth portion 475*d* may have a diameter that increases along the flow direction of a processing fluid.

A diameter D1 of each of the first portion 475*a* and the fifth portion 475*e* may be substantially the same as the diameter of the fluid supply line 420. The diameter D1 of each of the first portion 475*a* and the fifth portion 475*e* may range from about ¼ inch to about 1 inch. A diameter D2 of the third portion 475*c* may be less than the diameter D1 of each of the first portion 475a and the fifth portion 475e. The diameter D2 of the third portion 475c may be less than the diameter of the fluid supply line 420.

The descriptions of the structure of the wafer protecting device 475 of FIG. 11 may also applied to the wafer protecting device 477 in FIG. 10.

While non-limiting example embodiments of the present disclosure have been particularly shown and described, it will be understood that various changes in form and details may be made therein without departing from the spirit and scope of the present disclosure.

What is claimed is:

1. A fluid supply device configured to supply a processing fluid to a wafer processing device that includes a chamber, the fluid supply device comprising:
   a reservoir configured to change the processing fluid into a supercritical fluid state;
   a wafer protecting device comprising a body configured to prevent a wafer in the chamber of the wafer processing device from being damaged by the processing fluid in the supercritical fluid state by receiving the processing fluid in the supercritical fluid state and limiting a speed of the processing fluid; and
   a fluid supply line configured to provide a path for the processing fluid between the reservoir and the wafer protecting device and a path for the processing fluid between the wafer protecting device and the wafer processing device,
   wherein a width of the body of the wafer protecting device, in a direction perpendicular to a flow direction of the processing fluid within the wafer protecting device, is greater than a diameter of the fluid supply line, and
   wherein the wafer protecting device further comprises a mesh plate having a plurality of holes.

2. The fluid supply device of claim 1, wherein the fluid supply line is between and connected to the wafer protecting device and the wafer processing device, and the fluid supply line comprises a supply port having a linear shape.

3. The fluid supply device of claim 1, wherein the fluid supply line comprises a plurality of bends including a bend, and
   the wafer protecting device is between the bend and the wafer processing device along the fluid supply line, the bend being closest to the wafer processing device among the plurality of bends.

4. The fluid supply device of claim 1, wherein the fluid supply line comprises a plurality of bends including a bend, and
   the bend is between the wafer protecting device and the wafer processing device along the fluid supply line, the bend being closest to the wafer processing device among the plurality of bends.

5. The fluid supply device of claim 1, wherein a volume of the body of the wafer protecting device is 20% to 200% of a volume of the wafer processing device.

6. The fluid supply device of claim 1, wherein the body of the wafer protecting device has a cylindrical shape.

7. The fluid supply device of claim 1, wherein the body of the wafer protecting device comprises an input surface, an output surface, and a side surface, the input surface configured to allow the processing fluid to flow therethrough into the body of the wafer protecting device, the output surface configured to allow the processing fluid to be discharged therethrough from the body of the wafer protecting device, and the side surface connecting the input surface to the output surface,
   an input angle between the input surface and the flow direction of the processing fluid is greater than or equal to 90 degrees, and
   an output angle between the output surface and the flow direction of the processing fluid is less than or equal to 90 degrees.

8. The fluid supply device of claim 1, wherein the body of the wafer protecting device comprises an input surface, an output surface, and a side surface, the input surface allowing the processing fluid to flow therethrough into the body of the wafer protecting device, the output surface allowing the processing fluid to be discharged therethrough from the body of the wafer protecting device, and the side surface connecting the input surface to the output surface;
   an input angle between the input surface and the flow direction of the processing fluid is greater than or equal to 90 degrees; and
   an output angle between the output surface and the flow direction of the processing fluid is greater than or equal to 90 degrees.

9. The fluid supply device of claim 1, wherein the plurality of holes have an orifice structure.

10. The fluid supply device of claim 1, wherein a diameter of each of the plurality of holes is constant.

* * * * *